United States Patent [19]

Szasz et al.

[11] Patent Number: 4,949,031
[45] Date of Patent: Aug. 14, 1990

[54] ENVIRONMENTAL STRESS SCREENING APPARATUS FOR ELECTRONIC PRODUCTS

[75] Inventors: Norbert I. Szasz, Fremont, Calif.; Russell G. Shaw, Contoocook, N.H.

[73] Assignee: General Signal Corporation, Stamford, Conn.

[21] Appl. No.: 177,749

[22] Filed: Apr. 5, 1988

Related U.S. Application Data

[63] Continuation-in-part of Ser. No. 29,213, Mar. 23, 1987.

[51] Int. Cl.$^5$ .......................... G01R 1/02; G01R 1/04
[52] U.S. Cl. ............................ 324/158 F; 324/158 P; 277/34
[58] Field of Search ........... 324/73 PC, 158 F, 159 P; 219/385, 386, 388; 439/59, 62, 629, 259; 277/226, 34; 414/217

[56] References Cited

U.S. PATENT DOCUMENTS

| | | | |
|---|---|---|---|
| 3,133,180 | 5/1964 | Suverkropp | 324/73 R |
| 3,339,011 | 8/1967 | Ewers, Jr. et al. | 277/34 |
| 3,807,383 | 4/1974 | Lawler . | |
| 3,923,197 | 12/1975 | Kuhn | 277/226 |
| 3,958,552 | 5/1976 | Lawler . | |
| 3,977,387 | 8/1976 | Lawler . | |
| 4,045,735 | 8/1977 | Worcester et al. | 439/259 |
| 4,131,934 | 12/1978 | Becker et al. | 439/629 |
| 4,249,846 | 7/1981 | Worsham | 414/217 |
| 4,337,499 | 6/1982 | Cronin et al. | 361/413 |
| 4,352,274 | 10/1982 | Anderson et al. | 361/384 |
| 4,374,317 | 2/1983 | Bradshaw | 219/385 |
| 4,460,332 | 7/1984 | Lawler et al. . | |
| 4,468,616 | 8/1984 | Yoshizaki | 324/73 PC |
| 4,483,178 | 11/1984 | Miille | 439/62 |
| 4,542,341 | 9/1985 | Santomango et al. | 324/158 F |
| 4,566,594 | 1/1986 | Sleger et al. | 414/217 |
| 4,573,011 | 2/1986 | Rochat et al. | 324/158 F |
| 4,643,627 | 2/1987 | Bednorz et al. | 414/217 |
| 4,643,629 | 2/1987 | Takahashi et al. | 414/217 |
| 4,683,424 | 7/1987 | Cutright et al. | 324/158 F |
| 4,695,707 | 9/1987 | Young | 324/158 F |
| 4,699,555 | 10/1987 | Guarino | 414/217 |
| 4,812,750 | 3/1989 | Keel et al. . | |

FOREIGN PATENT DOCUMENTS

| | | | |
|---|---|---|---|
| 0184534 | 10/1984 | Japan | 324/158 F |
| 0113164 | 6/1985 | Japan | 324/73 PC |

OTHER PUBLICATIONS

"The Fourth Dimension in Memory Board Testing-Environmental Stress Screening", by Nicholson et al., 6/85, pp. 1-9, Proc. of ATE West Conf., 1985.
"Commercial Electronics ESS-Application and Fixturing Considerations", by Colby, 1/86, Proc. of ATE West Conf., 1986.
"Aerotronic Aquarius Stress Screening System for ECA Manuf." by IBM, 7/86.

Primary Examiner—Reinhard J. Eisenzopf
Assistant Examiner—W. Burns
Attorney, Agent, or Firm—Joseph P. Abate; Robert S. Smith

[57] ABSTRACT

Apparatus for environmental stress screening of electronic components includes a chamber having a wall defining an opening therein. A product carrier pallet has a portion dimensioned and configured to inserted in the opening. The portion of the product carrier pallet has a periphery and structure is provided to seal the periphery with respect to the opening. Structure is provided for conducting a plurality of electrical signals through the portion and for electrical coupling to the structure for conducting. The structure for electrical coupling is disposed outside of the product carrier pallet. The apparatus may include a zero insertion force connector. Other forms of the invention relate to a chamber having opposed aligned openings.

16 Claims, 9 Drawing Sheets

ENVIRONMENTAL STRESS SCREENING APPARATUS FOR ELECTRONIC PRODUCTS

RELATED APPLICATIONS

This application is a continuation-in-part of application Ser No. 029,213, filed Mar. 23, 1987. That earlier application and the present application are commonly owned.

BACKGROUND OF THE INVENTION

The present invention relates to apparatus for testing electronic circuit boards and other electronic assemblies. Traditional test for such boards use power or timing values corresponding to worst case conditions. Still other tests utilize a variety of patterns to eliminate those products that are pattern sensitive. Varying the input to such circuit boards/assemblies and particularly to digital boards provides an excellent means for finding bad or marginal parts and inefficient or improper manufacturing processes. Such test have done little to identify parts that are vulnerable to the so-called infant mortality failure mode.

Environmental stress screening is a process used to eliminate part and workmanship defects during the manufacture of electronic equipment. Such screening has been defined as the process or method where one hundred percent of a lot or group of identical items is subject to the application of physical climatic stresses or forces (or combinations thereof) to identify and eliminate defective, abnormal or marginal parts in manufacturing defects. The principle objective of environmental stress screening is to transform latent part and workmanship defects (inherent weaknesses that have a high probability of resulting in an early life failure) into detectable failures. This allows for their elimination before delivery to the end-users of the equipment. In other words the thrust of electronic stress screening is to find defects and to force latent defects to turn into failures prior to shipment. It has been established that failures that would not arise during the life of a device, under normal conditions, until 300-240,000 hours of operation, can be forced to occur in up to 48 hours by performing environmental stress screening. Thus, the initiation of failure by environmental stress screening results in a better product which will have fewer field failures. Simultaneous electronic testing with a load is essential during environmental stress screening because many failures are temperature dependent, that is, they will only show up at elevated or lowered temperatures.

Many leading corporations in the computer, telecommunication, automotive, military and aerospace segments of the electronics industry are currently employing environmental stress screening instead of or in conjunction with burn-in (elevated temperature only operation for extended periods). The screening parameters include variations in environmental conditions including dwell temperatures, dwell times, transition rate, number of cycles, etc.

Various apparatus has been devised for performing such tests. A typical arrangement is to provide a chamber with a printed circuit board that extends through a wall of the chamber. The board has an edge connector on each side of the wall. One edge connector, located on the outside of the chamber, is coupled to a load board. The other edge connector, located inside the chamber, is connected to the printed circuit board to be tested either directly or indirectly by means of a product carrier adapter. The product carrier adapter, in some prior art apparatus, is a module into which the printed circuit boards to be tested are mounted.

It is of great importance to have good electrical connections between the load module and the boards being tested to insure not only that any malfunctions are detected but also to insure that the board being tested is being subjected to the desired test conditions. Conventional connectors have, at least in some cases, not provided the desired degree of reliability. Conventional connectors which work well in the ambient environments, often cannot withstand the rigors of repeated environmental stress screening since the process causes them to repeatedly expand and contract. Still another problem is that a typical test arrangement will have many connections. For example, in the apparatus of the present invention there might be 128 connectors which each have 100 individual connections, thus, there would be 12,800 connections.

With a conventional insertion force of one quarter of one pound per individual connection, the total insertion force exceeds 1.5 tons! There is no other known apparatus that actually uses a such a large number of connectors, in part, because of the large forces and the danger of damage to the boards and connectors if there is even slight misalignment.

A limitation on the speed with which a product carrier pallet may be installed and removed from such environmental chambers and thus the utilization of such chambers is dependent on the speed with which the edge or other connectors joining the product carrier pallet to the load module can be accomplished.

Zero insertion force connectors are known. These connectors are typically operated mechanically or pneumatically. A problem inherent in attempting to use such connectors in conventional chamber structures is that the zero insertion force connector cannot tolerate the environmental conditions which are present in the chamber.

It is an object of the present invention to provide apparatus which will permit more rapid removal and installation of product carrier pallets in such chambers.

Another object of the invention to provide apparatus which utilizes zero insertion force connectors and which avoids degradation of the zero insertion force connectors due to the environmental conditions present in the chamber.

Still another object of the invention to provide apparatus which will utilize connectors having a high reliability to insure that the operating testing to be conducted is properly performed and properly monitored.

Yet another object of the invention to provide apparatus which can be rapidly reconfigured for different applications.

Another object of the invention is to provide apparatus which is readily adapted to either partial or complete automation.

Still another object of the invention is to provide some embodiments of the present invention which will more efficiently utilize the interior volume of anenvironmental stress screening chamber particularly where the product to be tested is relatively short as compared to the depth of the environmental stress screening chamber being utilized.

SUMMARY OF THE INVENTION

These and other objects of the invention may be achieved in apparatus for evironmental stress screening electronic components which includes a chamber having a wall defining an opening therein, a product carrier pallet having a portion dimensioned and configured to be inserted in the opening, the portion of the product carrier pallet has a periphery, means for sealing the periphery with respect to the opening, means for conducting a plurality of electrical signals through the portion, and means for electrical coupling to the means for conducting, the means for electrical coupling are disposed outside of the product carrier pallet.

The means for electrical coupling may comprise a zero insertion force connector. The chamber may have first and second openings disposed in opposed sides of the chamber. The openings may be disposed in opposed sides of the chamber in generally aligned relationship and the apparatus may further include a door on one of the openings which may be movable between an opened and a closed position. The means for sealing may be a pneumatic seal. The pneumatic seal may be manufactured of silicone rubber. The zero insertion force connector may be a double sided connector which cooperates with the product carrier pallet and an associated load module.

In some forms of the invention the chamber will have opposed aligned openings which may be of substantially the same size.

The first and second openings may be substantially the same size and maybe aligned. A product carrier module may be dimensioned and configured for insertion into at least one of the openings and may have a pneumatic seal disposed for sealing engagement between the first opening and the product carrier module. The product carrier module may be dimensioned and configured to extend simultaneously into both the first and second openings. A pneumatic seal may be disposed intermediate the product module and the second opening. A moveable door may be carried on the chamber for closing one of the openings. A load module may be disposed outside of the chamber proximate to one of the openings, the load module may include electrical connections for cooperation with the product module. The product carrier module and the load module may be separated by a pneumatic seal dimensioned and configured for engagement with one of the openings whereby the product carrier module may be inserted into the chamber and the pneumatic seal may be inflated while the load module is disposed in ambient climatic conditions. A load module may have a connector panel disposed on one face thereof, the connector panel may be provided with a pneumatic seal thereabout which may be dimensioned and configured for sealing engagement with one of the openings, the apparatus may further include a product carrier module which may include a portion for carrying electronic components to be tested, the product carrier module may be dimensioned and configured to be insertable through one of the openings into the chamber, the product module may further include a pneumatic seal dimensioned and configured disposed for sealing engagement with one the openings when the electronic components to be tested within the product module are within the the chamber.

BRIEF DESCRIPTION OF THE DRAWING

The invention will be better understood by reference to the accompanying drawing in which.

DESCRIPTION OF THE PREFERRED EMBODIMENTS

Figure 1:
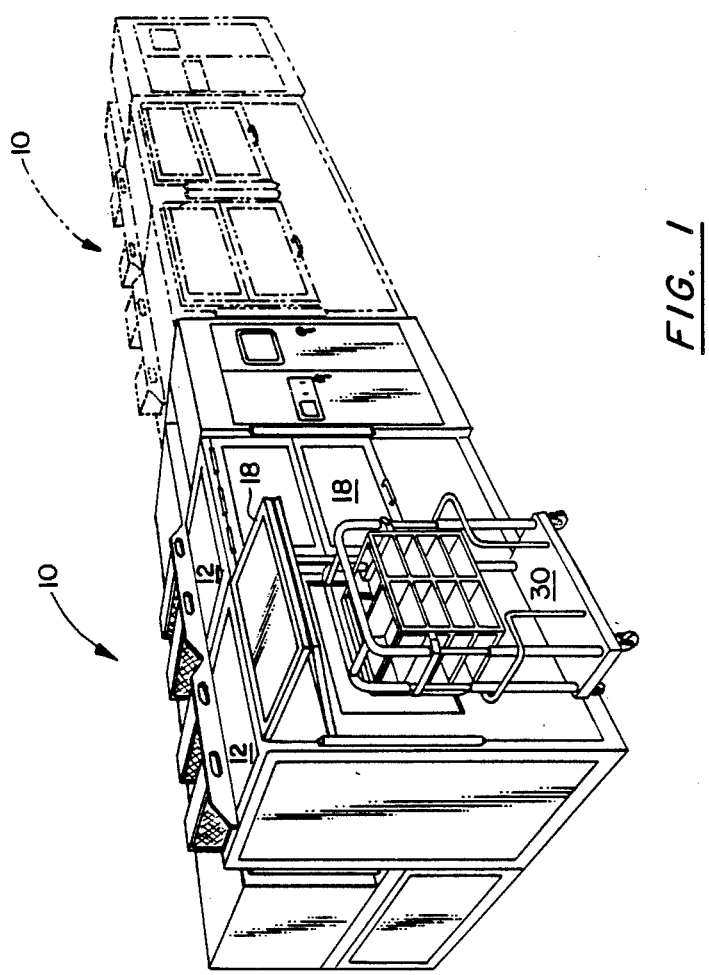
FIG. 1 is a perspective view of two environmental stress screening apparatus disposed in side-by-side relationship.

Referring now to FIGS. 1–4 there is shown environmental stress screening apparatus 10. Each apparatus 10 is the same as is implicit in FIG. 1. Many installations will require banks of such apparatus 10 in order to perform the necessary production tests on circuit boards following the completion of the manufacture. In the customary manner, each apparatus 10 will typically have two separate thermal chambers 12 to produce the required temperature changes. Typical apparatus 10 will incorporate two thirty horsepower compressors (not shown). Obviously, other sizes may be used for different applications. The twin compressor arrangement is used for rapid pull-down of the chamber air temperature and thus the temperature at which the product is tested. Typical test conditions provide for an air temperature change rate of 5–10 degrees Celsius per minute and a temperature range of 70–165 degrees Celsius usually between minus 40 and plus 125 degrees Celsius. The typical test will include 8–15 complete cycles which include dwell times. Ordinarily, the two chambers 12, 12 in each apparatus 10 will be cycled in phased relationship, that is, when one chamber 12 is heating the other chamber 12 will be cooling.

A typical chamber 12 is designed to accept a product carrier pallet 14 which will measure 24 inches deep by 48 inches wide and 36 inches high. The chambers 12 are constructed of laminated ridged panels with welded exterior corner reinforcements acting as supports to transfer the weight to a one-piece frame (not shown). The chamber 12 insulation 16 is typically a 4 inch thick polyisocyanurate. The panels which form the chamber 12 are laminated under high pressure using an epoxy based adhesive. A folding door 18 folds in two sections to provide clear access to the interior of the chamber 12 by means of an opening 20 in a side wall of the chamber 12. The folding door 18 may be operated automatically in some versions of the apparatus 10. The typical folding door 18 will have several latches, heavy duty hinges, double silicone gaskets and low wattage door edge heaters to prevent frost at the gasket area.

A typical thermal conditioning system inside the chamber 12 provides an air flow volume of 4,000 cubic feet per minute with an average velocity of approximately 1,000 linear feet per minute depending on the density of fixtures disposed within the chamber 12. The air flow can be adjusted for specific product to provide maximum heat transfer. The normal direction of the air flow is vertical and more specifically the air moves from the bottom of the chamber 12 to the top of the chamber 12. A damper 22 is used to by-pass or direct the air through the main evaporator coil 24.

The air circulation is provided by at least one blower 26. Typically, the blower 26 will have a squirrel cage construction and will be mounted on a shaft 28 which is journaled through the wall of the chamber 12. An external motor (not shown) with a V-belt drive (not shown) is coupled to the shaft 28.

A 55 kilowatt resistance heater 30 is disposed inside the chamber 12 in a typical embodiment and the heater 30 is of the type which uses an exposed nichrome wire for fast accurate temperature change. The location of the heater 30 in the chamber 12 prevents any radiant heat from reaching the product being tested since that product is located inside the product carrier pallet 14.

In a typical installation the chamber 12 contains two refrigeration coils or evaporator coils 24, 31. The first coil 24 referred to above is the main coil. A separate elevated temperature evaporator coil 31 always remains within the chamber 12 air flow path.

All products being tested are disposed within a product carrier pallet 14 which carries a plurality of product carrier assemblies (not shown) which ordinarily each carry a plurality of circuit boards (not shown) being tested. All connections to the product carrier pallet 14 from the outside of the chamber 12 will be accomplished through an edge connector (not shown) on one end of each printed circuit feed through board 40.

Figures 2, 3:
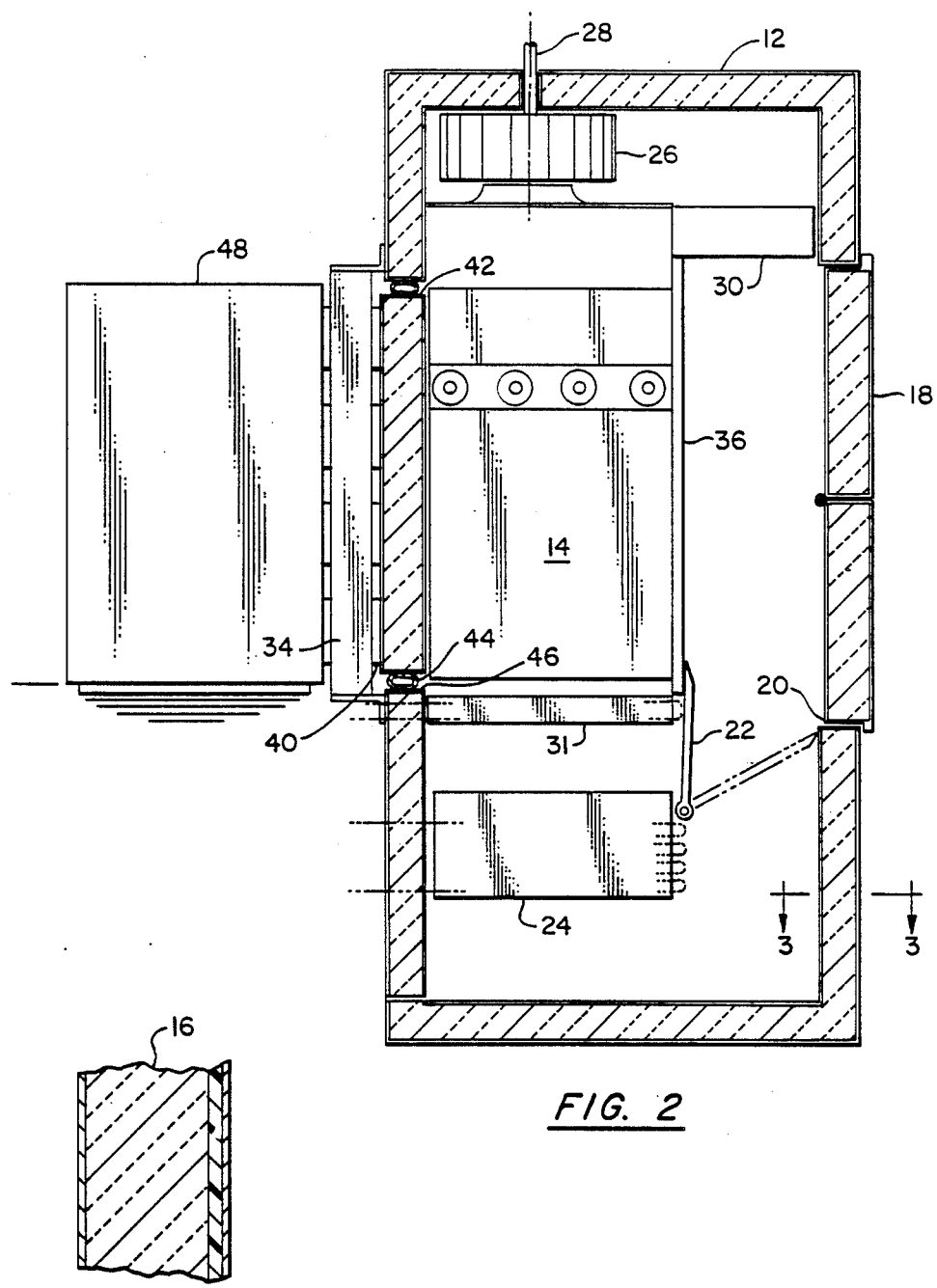
FIG. 2 is a partially schematic cross-sectional, elevational view of the apparatus in accordance with one form of the invention.
FIG. 3 is a fragmentary sectional view taken through the wall of the apparatus of FIG. 2 along the line 3—3.
Figure 4:
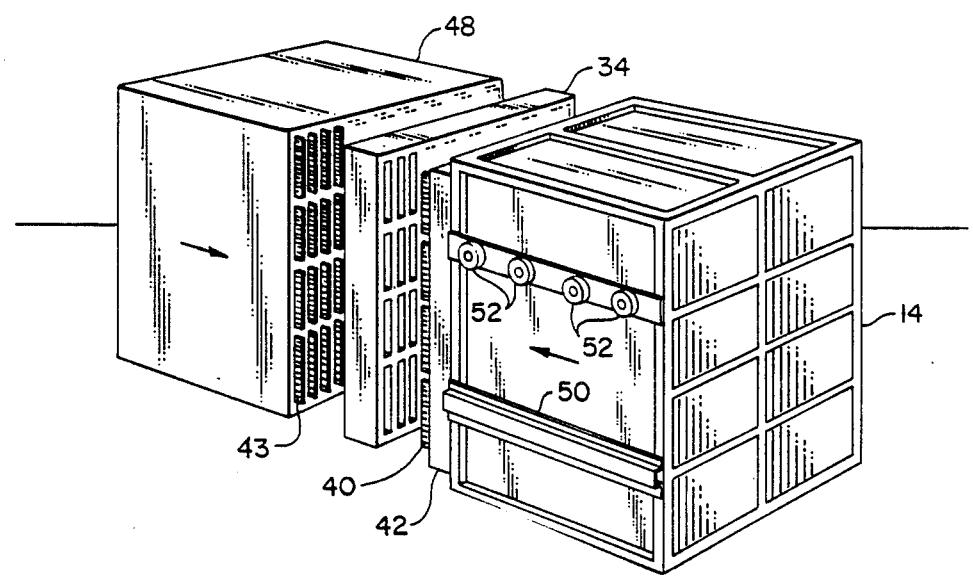
FIG. 4 is a partially schematic perspective view illustrating the product carrier pallet, zero insertion force connections and load-board module in greater detail.

The product carrier pallet 14 is dimensioned to pass through the opening 20 into the chamber 12 and this is accomplished with a product carrier pallet 14 and a transport cart 30 which allow off-line product loading and unloading to maximize system utilization by minimizing the time to load and unload the system. The front of each product carrier pallet 14 is provided with sliding doors 36 which prevent horizontal air flow and improve the temperature gradient through the fixturing area when the product carrier pallet 14 is in the chamber 12. The doors 36 are of reinforced sheet metal construction and allow accessibility to one half of the products loaded into the product carrier pallet 14 at any one time. The doors 36 also provide physical protection to the products during transport on the transport cart 30. The physical and electrical connections from the product (not shown) to the zero insertion force connectors 34 at the rear of the chamber 12 are by means of printed circuit feedthrough boards 40. The removable printed circuit feedthrough boards 40 are mounted in an insulated rear chamber plug 42. The plug 42 is constructed as an integral part of the product carrier pallet 14 and has a construction similar to the walls of the chamber 12. As best seen in FIG. 2, the plug 42 when installed constitutes the closure for the housing 12 on the left (as viewed) side. A combined face and inflatable perimeter silicone seal 44 attached to the opening 46 at the rear of the chamber 12 ensures an air tight fit between the plug 42 and the rear chamber opening 46. As will be seen in FIG. 2 the zero insertion force connectors 34 are fixed to the chamber 12 adjacent to the rear opening 46.

This structure permits the use of the zero insertion force connectors 34 to provide positive and reliable electrical contacts which can be rapidly connected and disconnected to insure maximum system utilization even though such zero insertion force connectors 34 would not be able to tolerate the environmental conditions present inside the chamber 12. An additional advantage of the zero insertion force connector 34 is that the female portion of the connector has an initial opening which is larger than conventional connectors and thus it is easier to engage the contacts despite accumulated tolerance conditions.

For some installations, the zero insertion force connectors 34 will be double faced and a load board module 48 which has printed circuit boards 43 extending from a face thereof for engagement with the illustrated double sided zero insertion force connectors 34. The load board module 48 supports and contains drive and/or load electronics to exercise the products under test. It will be understood that for some installations the load board module 48 need not be frequently changed. For such installations only a single sided zero insertion force connector 34 will be required and more specifically, the zero insertion force connector 34 will interface only with the feedthrough board 40 which extends through the plug 42.

The loading of the chamber 12 is accomplished by the operator rolling the product carrier pallet 14 into the chamber 12 by means of the cart 30. The cart 30 will ordinarily be provided with mechanical means for raising and lowering the product carrier pallet 14 with respect to the opening 20 in the chamber 12.

The product carrier pallet 14 is provided with elongated guides 50 (one shown) on opposed sides thereof. Four rollers 52, 52, 52, 52 are disposed above each guide 50. The respective axes of the rollers 52 are mutually parallel and disposed in a plane which is generally parallel to the direction of elongation of the guides 50, 50. The guides 50, 50 facilitate easy, rapid and precisely aligned insertion of the product carrier pallet 14. It will be understood that the zero insertion force connector 34 minimizes much of the difficulty inherent in the use of traditional edge connectors with all of the tolerance build up conditions that complicate the insertion of a large number of edge connectors each having their own tolerance conditions and each being subject to alignment problems and each being further aggravated by the temperature effects caused by the environmental testing. The zero insertion force connectors 34 exert a combined force on the edge connectors of the feedthrough boards which is close to a ton. The product carrier pallet 14 is simultaneously held in place by the perimeter seal 44. In the preferred embodiment, the zero insertion force connectors 34 are pneumatically actuated by 40 psig of air pressure. The zero insertion force connectors 34 close automatically when the edge connectors of the feedthrough boards 40 have been inserted. The contacts of the zero insertion force connectors 34 are self cleaning, wiping contacts which have an expected usable life of over 1 million cycles. In a common form of the present invention, the spacing between the feedthrough boards 40 is three inches center to center. Current carrying capacity is 5 amps per contact. Each contact has minimal resistance and thus is suitable for low level signals and provides 2500 VDC isolation. The contact materials are beryllium copper with gold plating.

The zero insertion force connector in accordance with the present invention is manufactured by the Quality Research Engineering Corp. of Anaheim, California and bears the part number 102203. Various other zero insertion force connectors may be utilized. The connectors 34 are pneumatically operated in the preferred embodiment. In other forms of the invention mechanical or other actuation is possible.

The modular construction provides transportability which enable off-site loading and rapid change over of product drive configurations depending on the product to be tested. The load board module 48 construction enables the user to make very rapid changes in the manner of test. The transport cart 30 is also used to exchange and transport load board modules 48.

Figure 10:
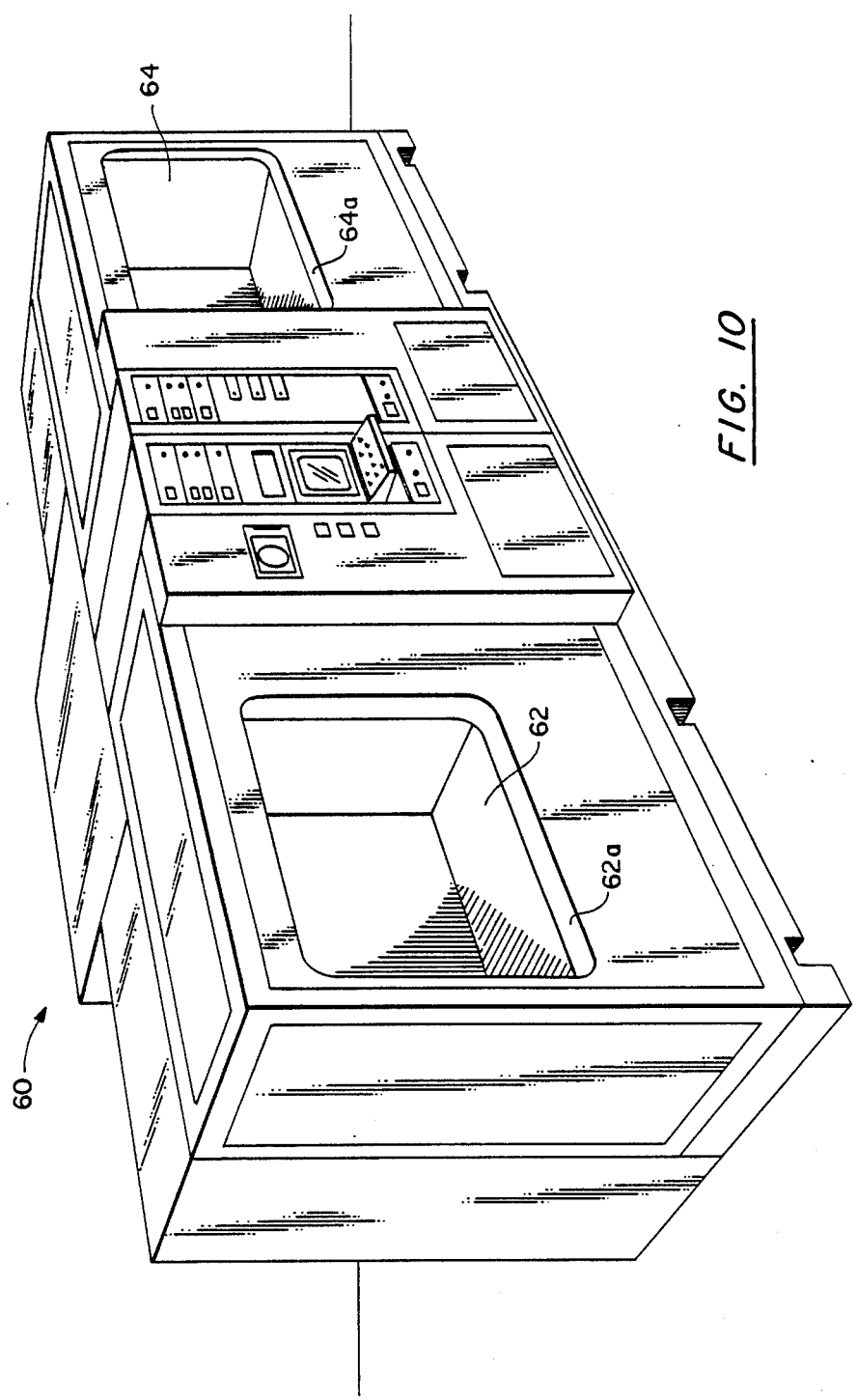
FIG. 10 is a partially schematic perspective view of the basic environmental stress screening apparatus which is common to the apparatus shown in FIGS. 5–9.

Referring now to FIGS. 5-10 there are shown additional embodiments of the apparatus in accordance with the invention. More specifically, FIG. 10 shows a basic environmental stress screening apparatus 60 which is common to the embodiments illustrated in FIGS. 5-9. The stress screening apparatus 60 includes first and second chambers 62, 64. Each chamber 62, 64 has aligned front and rear openings. The height of the respective front opening 62a and 64a is ordinarily substantially the same as the height of the chamber 62, 64. Similarly, the width of the opening 62a, 64a are respectively substantially the same as the width of the chambers 62, 64. Similarly, the aligned rear openings 62b and 64b are substantially the same size. The relatively large dimensions of the openings 62a, 62b, 64a, 64b maximizes access to the respective chambers 62, 64.

Although the stress screening apparatus 60 has minor differences in appearance in FIGS. 5-10, conceptually the apparatus 60 is essentially identical apparatus characterized by two separate chambers which will ordinarily be operated in phased relationship. In other words, one chamber, such as 62, is heating while the other chamber such as 64 is cooling. The basic module or stress screening apparatus 60 may be supplied to a purchaser and thereafter adapted for a large number of environmental stress screening apparatus testing as will be apparent from the description of FIGS. 5-9.

Figure 5:
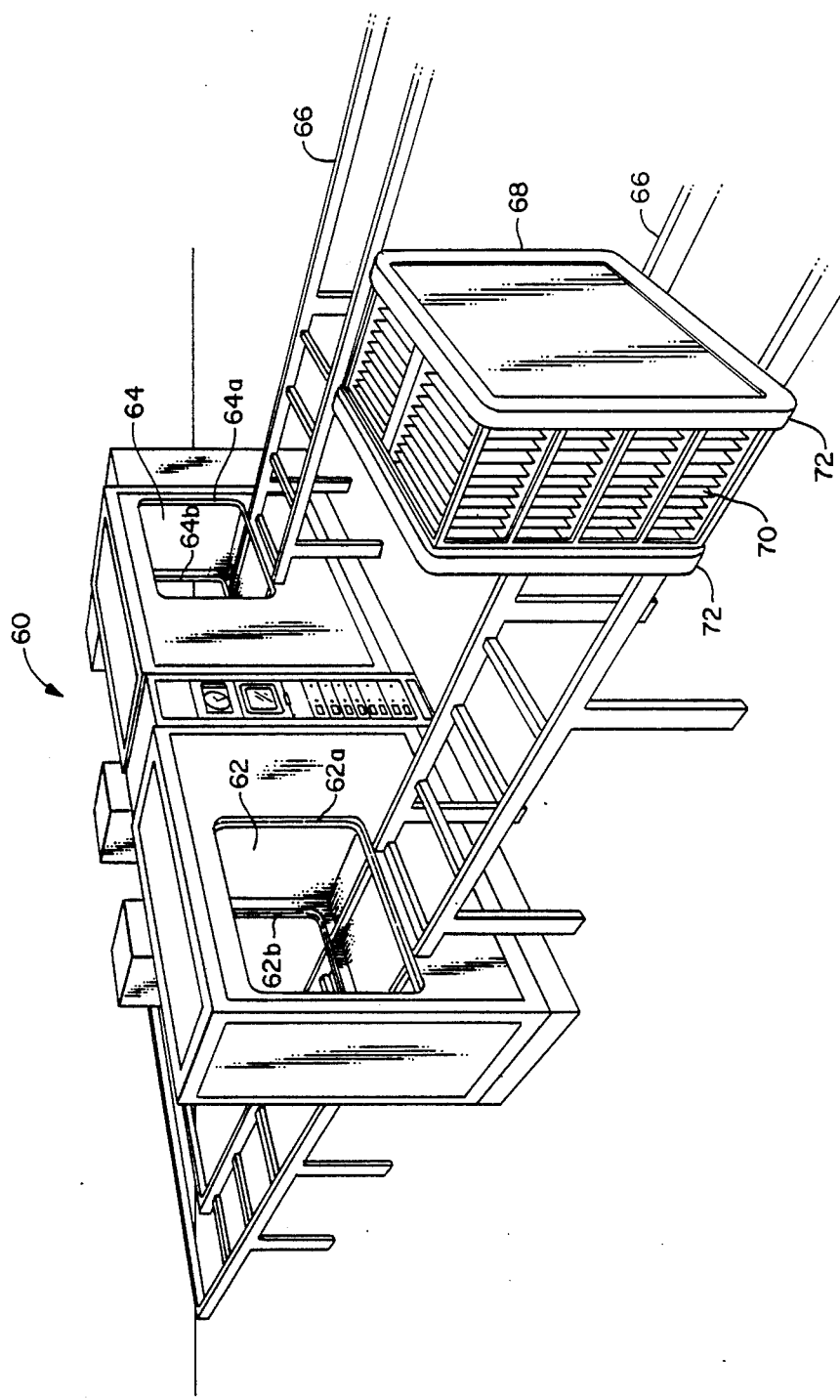
FIG. 5 is a partially schematic perspective view of another embodiment of the invention in which pneumatic seals are provided on the front and rear faces for cooperation with respectively the front and rear openings of an environmental stress screening chamber.

Referring now to FIG. 5 there is shown apparatus which includes respective rails 66, 66 aligned with the chambers 62, 64. A product carrier assembly 68 adapted to carry and provide electrical connections to a large number of printed circuit boards or other electronic components 70 is constructed to slide on the railing 66 and into the chamber 62 or the chamber 64. This form of the invention has the capability of being automated either partially or fully at relatively low cost.

With conventional stress screening apparatus, it is necessary to utilize an automatic guided vehicle (AGV) to automate stress screening testing. Such automatic guided vehicles are extremely expensive to acquire and maintain and this limits the practicality of automating stress screening systems for most potential users. The present apparatus, by providing a through flow of work product such as in the opening 62a and out the opening 62b, lends itself to relatively inexpensive automation. It will be understood that the product carrier assembly 68 may be pushed through the chamber 62 by relatively simple apparatus which would also incorporates means for automatically inflating the pneumatic seals 72, 72 on the respective edges of the front and rear faces of the product carrier assembly 68. It will be understood that a load module will be necessary and this (1) load module may either be incorporated into a portion of the product carrier assembly 68 which is not in the chamber 62 during testing procedures and thus is not exposed to the extremes of temperature or (2) may be a separate part which may be connected by connectors which may be very conventional such as pin and socket connectors or alternatively, zero insertion force connectors as described with respect to the embodiments of FIGS. 1-4.

Figure 6:
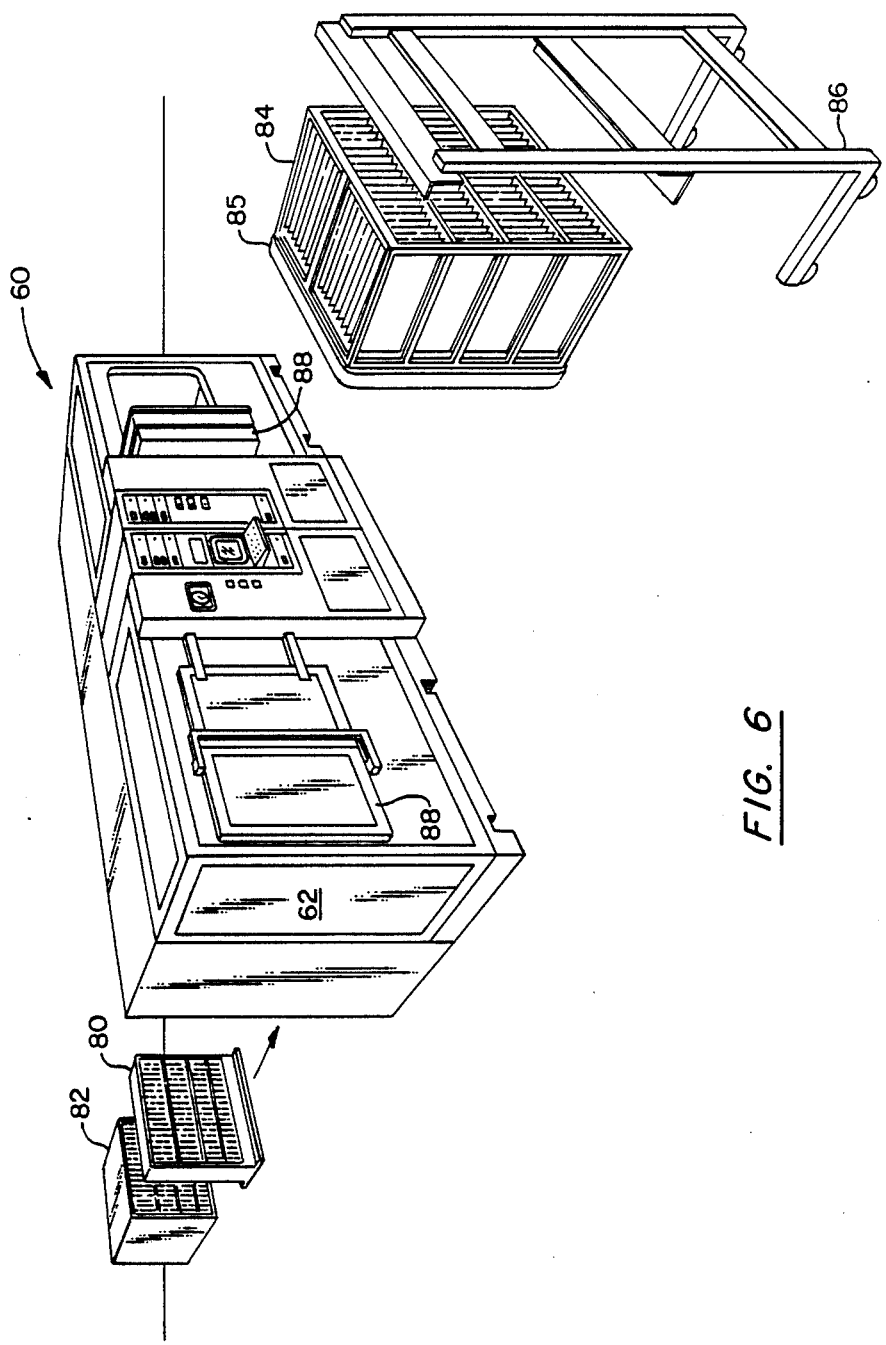
FIG. 6 is a partially schematic exploded perspective view of still another form of the invention in which a load board rack is fixed behind a zero insertion force and after which is fixed behind the environmental stress screening chamber which is provided with a front opening for accommodating a product pallet carried on a transporter.

In the embodiment of FIG. 6, the basic stress screening apparatus 60 is provided with a fixed zero insertion force connector package 80 which in turn cooperates with a fixed load board rack 82. A product carrier assembly 84 is carried on a transporter 86 for insertion into a rack (not shown) within the chamber 62. A door 88 is provided on the front face of the chamber 62 and closes the front opening of the chamber 62 after insertion of the product carrier assembly 84 into the chamber 62 with seal 85 sealing the rear most opening of the chamber 62.

Figure 7:
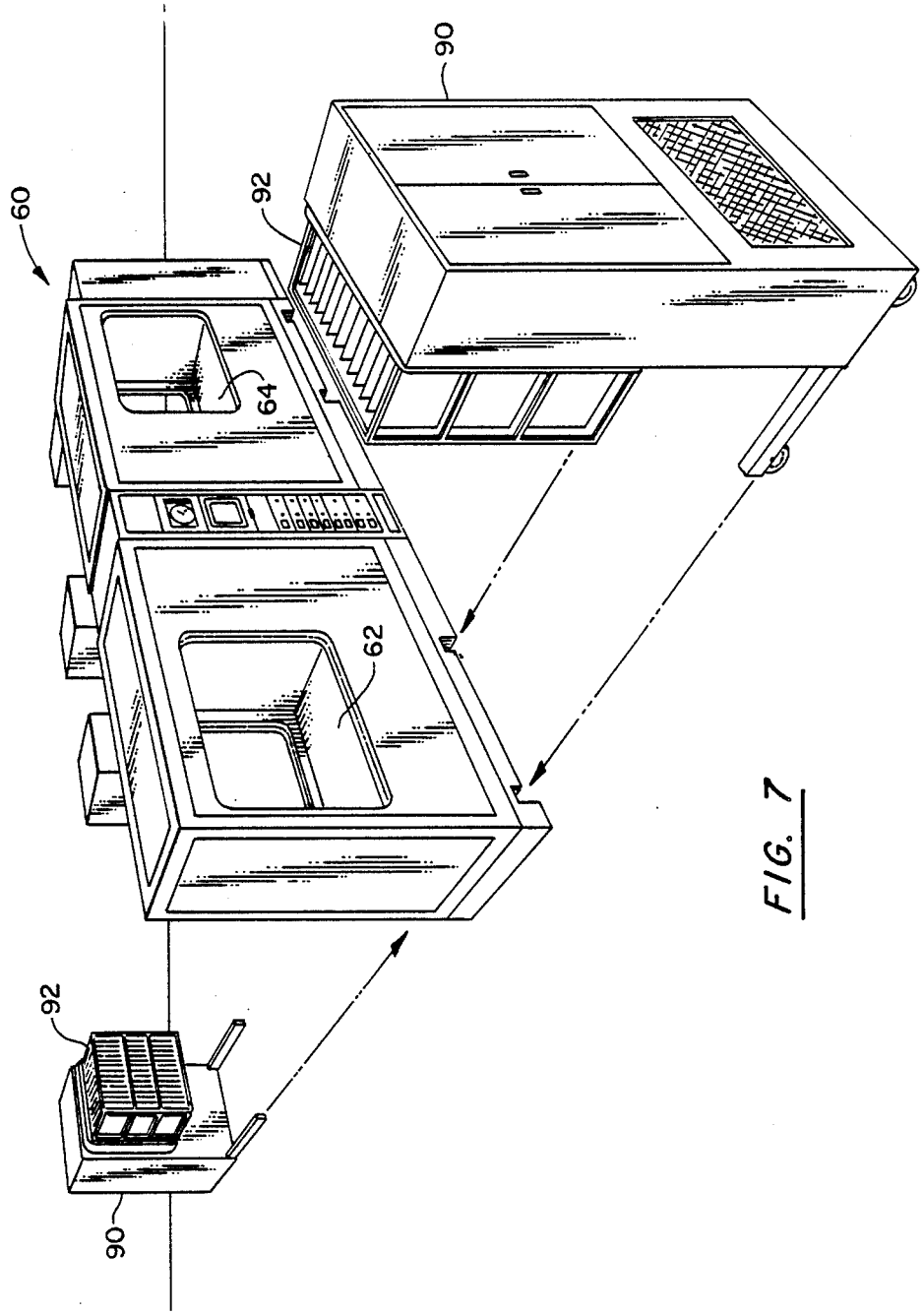
FIG. 7 is a partially schematic perspective view of still another form of the apparatus in accordance with the invention which utilizes two carts which are identical and which each include a load module and which each carry a product carrier assembly having a pneumatic seal for cooperation with the respective front and rear openings of the environmental stress screening apparatus.

Referring now to FIG. 7 there is shown still another embodiment of the invention. Two identical carts 90 each include a load module and an integral transporter. The carts 90, 90 also carry respective product carrier assemblies 92, 92. This embodiment of the invention is particularly useful to utilize the full depth of the chamber 62 for many electronic components that are tested. More specifically, in conventional apparatus the load module may have connectors which extend through one face of the environmental stress screening chamber and the product is inserted from the opposite face. If the depth of the product being tested in substantially less than the depth of the chamber 62 then there will be considerable space that is wasted. With the arrangement shown in FIG. 7 each product assembly carrier 92 may each take up approximately half or less of the depth of the respective chamber 62 and thus substantially twice the amount of product may be tested at any one time.

Figure 8:
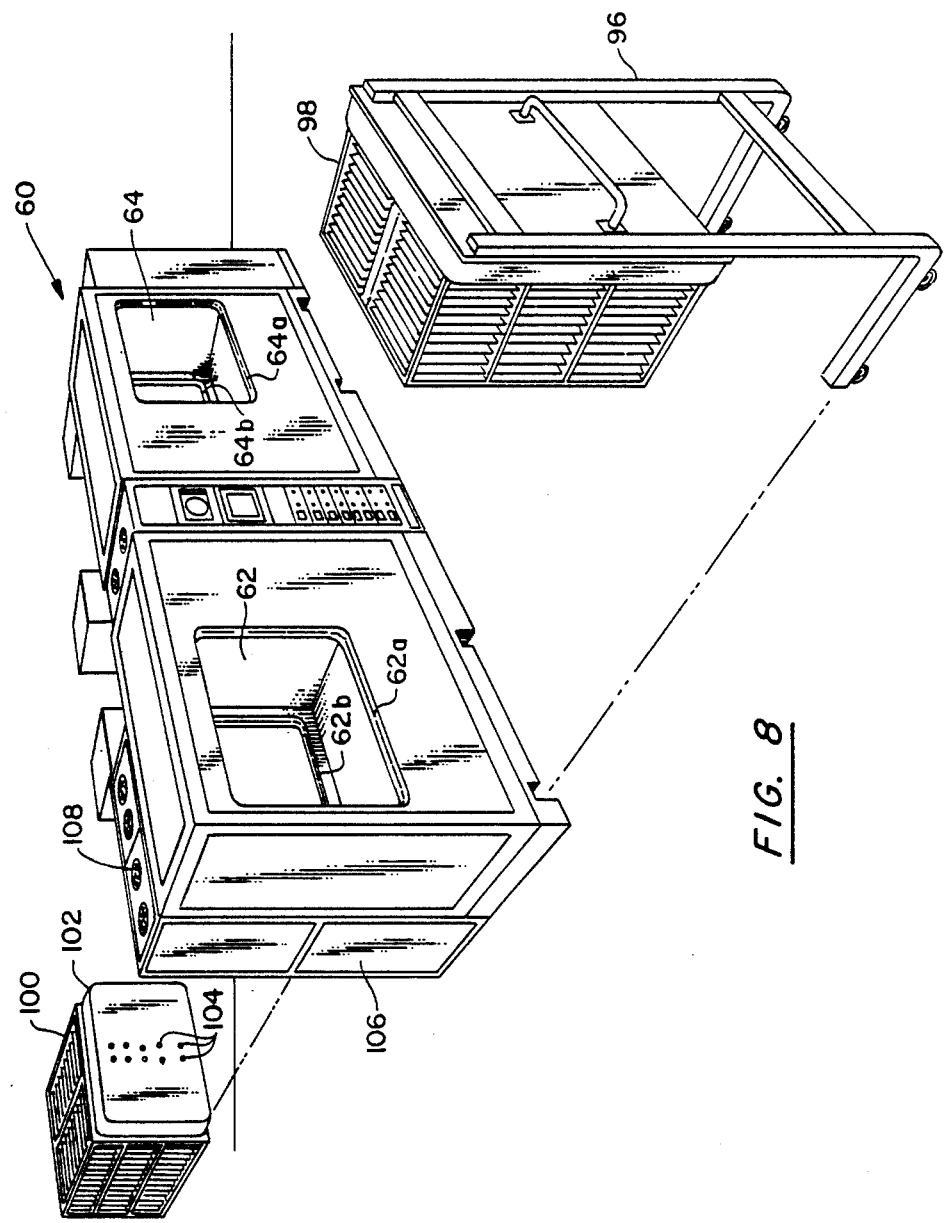
FIG. 8 is a partially schematic perspective view of still another form of the invention in which the basic environmental stress screening chamber cooperates with a product carrier assembly on a transporter and a fixed load module which interfaces to the product carrier module by means of conventional pin and socket connectors.
Figure 9:
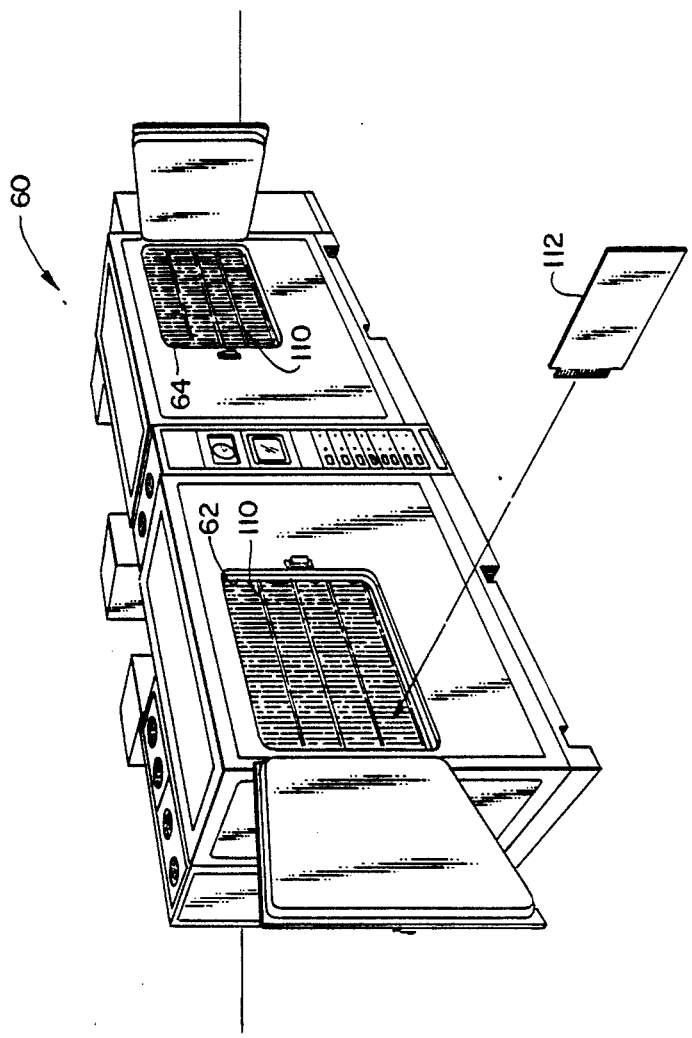
FIG. 9 is a partially schematic perspective view of an arrangement which includes a rack for holding a plurality of printed circuit boards. The printed circuit boards may be carriers for either chips that are being tested of may themselves be the product being tested.

Referring now to FIG. 8 there is shown still another form of the invention in which a transformer 96 supports a product carrier assembly 98. A load module 100 has a connector panel 102 fixed thereto and the combination of the load module 100 and the connector panel 102 is fixed in the rear opening 62b the sockets 104 and the connector panel 102 cooperating with pins (not shown) on the product assembly carrier 98 to make the required electrical connections. A rear enclosure 106 includes fans (not shown) connected to vents 108 to dissipate the substantial energy generated by the load module 100.

The apparatus shown in FIG. 9 again uses the basic environmental stress screening apparatus 60 together with respective racks 110, 110 disposed in the chambers 62, 64. Each rack accommodates a plurality of printed circuit boards 112. The printed circuit boards 112 may be the end assembly which is being tested or may be merely carriers for testing of chips or other electronic components that are mounted on the board 112.

Those skilled in the art will recognize that various modifications of the present invention may be provided without departing from the spirit of the invention. For example, the chamber could be provided with only a single opening and the product carrier pallet in which the electronics to be tested might be provided with a plug such as plug 42 rather than having opposed openings as in the preferred embodiment described herein. It is thus intended that the invention be limited only by the scope of the appended claims.

We claim:

1. Apparatus for environmental stress screening of electronic components which comprises:
   a chamber having a wall defining an opening therein;
   a product carrier pallet having a portion dimensioned and configured to be inserted in said opening, said portion of said product carrier pallet having a periphery;
   means for sealing said periphery with respect to said opening including an inflatable peripheral seal;
   means for conducting a plurality of electrical signals through said portion; and
   means for electrical coupling to said means for conducting, said means for electrical coupling being disposed outside of said product carrier pallet.

2. The apparatus as described in claim 1 wherein:
   said means for electrical coupling comprising a zero insertion force connector.

3. The apparatus as described in claim 2 wherein:
   said chamber has first and second openings disposed in opposed sides of said chamber and said first and second openings each are dimensioned for passage of said product carrier module.

4. The apparatus as described in claim 1 wherein:
   said first and second openings disposed in opposed sides of said chamber in generally aligned relationship and said first and second openings each are dimensioned for passage of said product carrier module and said apparatus further includes a door on one of said openings which is movable between an opened and a closed position.

5. The apparatus as described in claim 3 wherein:
   said inflatable peripheral seal is manufactured of silicone rubber.

6. The apparatus as described in claim 2 wherein:
   said zero insertion force connector is a double sided connector which cooperates with said product carrier pallet and an associated load module.

7. The apparatus for environmental stress screening electronic components which comprises:
   a substantially closed chamber having opposed walls defining respective first and second openings therein, said first and second openings being dimensioned for passage of said product carrier module and being substantially the same size and mutually aligned, and a product carrier module dimensioned and configured for insertion into either said first opening or said second opening and having a inflatable peripheral seal disposed for sealing engagement between said first opening and said product carrier module.

8. The apparatus as described in claim 7 wherein:
   said product carrier module is dimensioned and configured to extend simultaneously into both said first and second openings.

9. The apparatus as described in claim 8 further including:
   an inflatable peripheral seal is disposed intermediate said product module and said second opening.

10. An apparatus for environmental stress screening electronic components which comprises:
    a substantially closed chamber having opposed walls defining respective first and second openings therein, said first and second openings being dimensioned for passage of a product carrier module and being substantially the same size and mutually aligned, and said product carrier module dimensioned and configured for insertion into either said first opening or said second opening and having a inflatable peripheral seal disposed for sealing engagement between said first opening and said product carrier module, said product carrier module being dimensioned and configured to extend simultaneously into both said first and second openings, said apparatus also including an inflatable peripheral seal disposed intermediate said product module and said second opening, said product carrier module having respective opposed faces which are substantially each coplanar with said opposed walls of said chamber.

11. The apparatus as described in claim 10 further including:
    a moveable door carried on said chamber for closing one of said first and second openings.

12. The apparatus as described in claim 11 further including:
    a load module disposed outside of said chamber proximate to one of said first and second openings, said load module including electrical connections for cooperation with said product module.

13. The apparatus as described in claim 10 further including:
    a load module, said product carrier module and said load module being separated by an inflatable peripheral seal dimensioned and configured for engagement with one of said first and second openings whereby said product carrier module may be inserted into said chamber and said inflatable peripheral seal may be inflated while said load module is disposed in ambient climatic conditions.

14. The apparatus as described in claim 10 further including:
    a load module having a connector panel disposed on one face thereof, said one face being provided with an inflatable peripheral seal thereabout which is dimensioned and configured for sealing engagement with one of said first and second openings, said apparatus further including a product carrier module which includes a portion for carrying electronic components to be tested, said product carrier module being dimensioned and configured to be insertable through one of said first and second openings into said chamber, said product module further including an inflatable peripheral seal dimensioned and configured and disposed for sealing engagement with one of said first and second openings when the electronic components to be tested within said product module are within said chamber, said product carrier module having electrical connections to said connector panel.

15. The apparatus as described in claim 10 wherein:
said first and second openings have substantially the same height and width dimensions as said chamber.

16. Apparatus for environmental stress screening of electronic components which comprises:
a chamber having a wall defining an opening therein;
a product carrier pallet having a portion dimensioned and configured to be inserted in said opening, said portion of said product carrier pallet having a periphery;
means for sealing said periphery with respect to said opening including an inflatable peripheral seal;
means for conducting a plurality of electrical signals through said portion; and
means for electrical coupling to said means for conducting, said means for electrical coupling being disposed outside of said product carrier pallet, said means for electrical coupling comprising a zero insertion force connector, said chamber having first and second openings disposed in opposed sides of said chamber and said first and second openings each are dimensioned for passage of said product carrier module, said first and second openings having substantially the same height and width dimensions as said chamber.

* * * * *